United States Patent
Eskridge

(10) Patent No.: US 6,991,957 B2
(45) Date of Patent: Jan. 31, 2006

(54) MICRO-MACHINED ELECTROMECHANICAL SYSTEM (MEMS) ACCELEROMETER DEVICE HAVING ARCUATELY SHAPED FLEXURES

(75) Inventor: Mark H. Eskridge, Renton, WA (US)

(73) Assignee: Honeywell International, Inc., Morristown, NJ (US)

( * ) Notice: Subject to any disclaimer, the term of this patent is extended or adjusted under 35 U.S.C. 154(b) by 22 days.

(21) Appl. No.: 11/000,652

(22) Filed: Nov. 30, 2004

(65) Prior Publication Data

US 2005/0202585 A1 Sep. 15, 2005

Related U.S. Application Data

(62) Division of application No. 10/223,947, filed on Aug. 20, 2002, now Pat. No. 6,897,538.

(60) Provisional application No. 60/313,777, filed on Aug. 20, 2001.

(51) Int. Cl.
*H01L 21/00* (2006.01)
(52) U.S. Cl. .................... 438/50; 257/415; 73/514.29
(58) Field of Classification Search ................ 438/50; 257/415; 73/514.29
See application file for complete search history.

(56) References Cited

U.S. PATENT DOCUMENTS

| | | | |
|---|---|---|---|
| 4,099,409 A | 7/1978 | Edmond | |
| 4,435,737 A | 3/1984 | Colton | |
| 4,922,756 A | 5/1990 | Henrion | |
| 5,245,504 A | 9/1993 | Bullis et al. | |
| 5,484,073 A | 1/1996 | Erickson | |
| 5,650,568 A | 7/1997 | Greiff et al. | |
| 5,948,981 A * | 9/1999 | Woodruff | 73/514.29 |
| 6,257,060 B1 * | 7/2001 | Leonardson et al. | 73/514.29 |
| 6,285,111 B1 | 9/2001 | Hulsing, II | |
| 6,428,713 B1 | 8/2002 | Christenson et al. | |
| 6,642,067 B2 | 11/2003 | Dwyer | |
| 6,768,181 B2 | 7/2004 | Dwyer | |

FOREIGN PATENT DOCUMENTS

| | | |
|---|---|---|
| EP | 1 031 837 A1 | 8/2000 |
| GB | 2 192 718 A | 1/1988 |

OTHER PUBLICATIONS

ABSTRACT, Patent Abstracts of Japan, Publication No. 10104263, Publication Date: Apr. 24, 1998.
Application No. JP19960279995 19961001; Muro Hideo, et al. "Semiconductor Acceleration Sensor and Manufacture Thereof".

* cited by examiner

*Primary Examiner*—Luan Thai
(74) *Attorney, Agent, or Firm*—Charles J. Rupnick Attorney at Law

(57) ABSTRACT

A method for suspending a movable structure form a support structure wherein first and second flat and thin arcuately shaped flexures are formed having spaced apart substantially planar and parallel opposing surfaces, each of the first and second flexures being structured for connection between a support structure and a movable structure to be suspended from the support structure and being aligned along a common axis of rotation between the support structure and the movable structure.

18 Claims, 6 Drawing Sheets

MICRO-MACHINED ELECTROMECHANICAL SYSTEM (MEMS) ACCELEROMETER DEVICE HAVING ARCUATELY SHAPED FLEXURES

This application is a divisional of application Ser. No. 10/223,947, filed Aug. 20, 2002, now U.S. Pat. No. 6,897,538, issued May 24, 2005, which claims the benefit of U.S. Provisional 60/313,777, filed on Aug. 20, 2001.

FIELD OF THE INVENTION

The present invention relates generally to micro-machined electromechanical sensor (MEMS) devices and methods for manufacturing the same, and in particular to suspension devices and methods for mounting rotational masses in MEMS devices.

BACKGROUND OF THE INVENTION

Many micro-machined electromechanical sensor (MEMS) devices and methods for manufacturing the same are generally well-known. See, for example, U.S. Pat. No. 6,642,067, METHOD OF TRIMMING MICRO-MACHINED ELECTROMECHANICAL SENSORS (MEMS) DEVICES, issued Nov. 4, 2003, to Paul W. Dwyer, which is assigned to the assignee of the present application and the complete disclosure of which is incorporated herein by reference, that describes a MEMS acceleration sensor and method for manufacturing the same. In another example, U.S. Pat. No. 6,428,713, MEMS SENSOR STRUCTURE AND MICROFABRICATION PROCESS THEREFORE, issued to Christenson, et al. on Aug. 6, 2002, which is incorporated herein by reference, describes a capacitive acceleration sensor formed in a semiconductor layer as a MEMS device. Other known MEMS devices include, for example, micro-mechanical filters, pressure sensors, gyroscopes, resonators, actuators, and rate sensors, as described in U.S. Pat. No. 6,428,713.

MEMS accelerometer devices generally measure acceleration forces applied to a body by being mounted directly onto a surface of the accelerated body. One common type of MEMS accelerometer is the capacitive accelerometer. As disclosed in U.S. Pat. No. 4,435,737, LOW COST CAPACITIVE ACCELEROMETER, issued to Colton on Mar. 6, 1984, which is incorporated herein by reference, capacitive accelerometers are generally well known in the art. In a closed-loop capacitive accelerometer, the acceleration sensor is a proof mass suspended by flexures or hinges for rotation relative to an outer frame portion. The acceleration sensor is bonded between glass plates with the proof mass forming a differential capacitor with the glass plates.

The proof mass rotates about the flexures according to the principle of Newton's law: F=ma, when subjected to acceleration along the input or "sensitive" axis which is normal to the plane of the proof mass. An electrical drive and sense circuit measures applied acceleration force as a function of the displacement of the proof mass and the resulting differential capacitance.

Accelerometers of the type that are based on a rotating mass often need to be firmly constrained relative to the in-plane axes while being permitted movement in the third input axis. In devices having a rotating mass, the position of the axis of rotation also needs to be constrained. Recently, the proof mass and flexures have been fabricated in an active epitaxial or layer grown on a silicon substrate. The proof mass and flexures are structured using Reactive Ion Etching (RIE) or Deep Reactive Ion Etching (DRIE), which permits etching of very narrow slots between nearly vertical walls. DRIE permits the width, length, and thickness of the flexures to be closely controlled so that desirable bending characteristics are obtained. The flexures define a linear axis of rotation or "hinge" axis about which the proof mass moves in response to an applied force, such as the acceleration of the accelerated body, for example, a vehicle, aircraft or other accelerated body having the accelerometer mounted thereon. Traditionally, the flexures are substantially rectangularly shaped with a substantially constant cross-sectional area. The substantially rectangular shape gives the flexures greater in-plane stiffness along the major axis, i.e., the accelerometer hinge axis, and substantially less in-plane stiffness along its minor axis.

Prior art micromachined accelerometers have effectively used the substantially rectangular flexures for pliantly suspending a rotating or translating proof mass. However, the flexures of some prior art devices, such as those fabricated using RIE or DRIE, are essentially two-dimensional designs that do not permit changes in material thickness that can be used to control flexure stiffness. The rectangular flexures operate as a beam having a constant area moment of inertia, I, which is defined as the integral of the area of the cross-section times the square of the distance of the incremental area from the neutral axis. See, e.g., Shigley, MECHANICAL ENGINEERING DESIGN, $3^{rd}$ edition, page 45, which is incorporated herein by reference. The rectangular flexures bend along their entire lengths, similarly to a beam of constant cross-section that is supported at both ends. The rectangular flexures therefore lack a well-defined hinge axis.

SUMMARY OF THE INVENTION

The present invention overcomes limitations of the prior art for providing proof mass suspension in a force sensor, which is critical to isolating the accelerometer mechanism from in-plane force inputs during operation while responding to out-of-plane force inputs.

The arcuate suspension apparatus of the invention is stiffer when loaded in the plane of the arcuate shape than out-of-plane. The arcuate suspension apparatus transfers in-plane loads along the included arch, which causes the arcuate suspension apparatus to be strong and rigid in opposing in-plane loads, and flexes or bends when subjected to out-of-plane loads, which causes the arcuate suspension apparatus to be flexibly compliant when loaded out-of-plane.

According to one aspect of the invention, the arcuate suspension apparatus includes a first substantially arcuately shaped flexure having a cross-section that is relatively substantially extended in the plane of the arcuate shape, the first flexure having a first end structured for connection to a support structure and a second end structured for connection to a movable structure to be suspended from the support structure; and a second substantially flexure that is arcuately shaped similarly to the first flexure and having a cross-section that is relatively substantially extended in the plane of the arcuate shape and having a first end structured for connection to the support structure and a second end structured for connection to the movable structure, the arcuate shape of the second flexure being aligned with the arcuate shape of the first flexure and with the first flexure forming a hinge having an axis of rotation that extends through the first and second flexures. The arcuate shape of the first and second flexures are aligned either facing oppositely from one another, or facing toward one another.

According to another aspect of the invention, the invention includes a structure to be suspended and a support structure spaced away from the structure to be suspended. The first ends of the first and second flexures are connected to the support structure, and the second ends of the first and second flexures are connected to the structure to be suspended.

According to another aspect of the invention, the structure to be suspended is an accelerometer sensor mechanism structured using micro-machined electromechanical sensor (MEMS) techniques in an epitaxial growth of semiconductor material on a silicon substrate.

According to still other aspects of the invention, methods for suspending an acceleration apparatus are provided.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF PREFERRED EMBODIMENT

In the Figures, like numerals indicate like elements.

The present invention is an apparatus and method for suspending a relatively movable structure of an acceleration sensor, i.e., a proof mass, from a support structure, i.e., an inner sensor frame. The suspension apparatus of the invention includes at least first and second arcuately shaped flexures each having similar cross-sections that are relatively substantially extended in a plane in which the arcuate shape lies. The first and second arcuately shaped flexures each have a first end structured for connection to the support structure and a second end structured for connection to the movable structure that is to be suspended from the support structure. The first and second flexures both lie in the same plane and are aligned with their respective outer arcuate shapes facing oppositely each from the other and forming a hinge having an axis of rotation in the plane of the first and second arcuate shapes that extends linearly through respective portions of the first and second flexure that are aligned substantially cross-wise to the axis of rotation.

Figure 1:
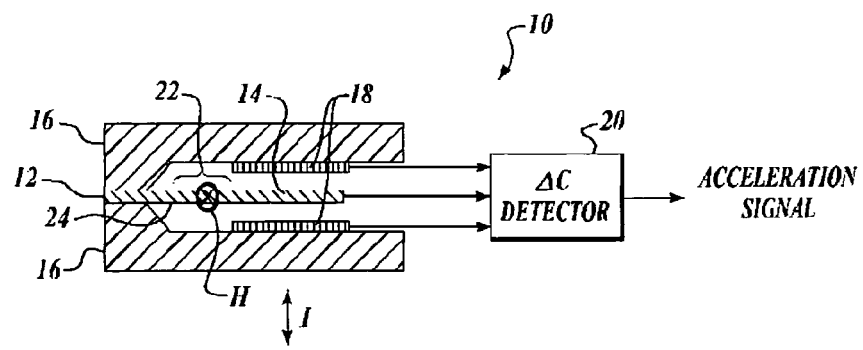
FIG. 1 is a side view of a basic single proof mass differential capacitance accelerometer, including drive and sense electronics.

FIG. 1 is not to scale but clearly illustrates the apparatus and method of the invention embodied by example and without limitation in a suspension structure for pliantly suspending a single cantilevered proof mass in a micro-machined electromechanical sensor (MEMS) accelerometer 10. For clarity, the top and bottom cover plates are shown spaced apart from the sensor mechanism 12. The sensor mechanism 12 is structured in an epitaxial growth or "active" semiconductor layer grown on a silicon substrate (not shown). Structuring of the sensor mechanism 12 includes structuring a cantilevered proof mass 14 operable as a rotating or "moveable" electrode. Opposing cover plates 16 are formed in glass wafers and provided with fixed surface electrodes 18. The sensor mechanism 12 is bonded, for example, by electrostatic bonding, to one of the two cover plates 16 with the fixed electrode 18 aligned with one planar surface of the proof mass 14. The silicon substrate is removed, leaving the sensor mechanism 12, including the second surface of the proof mass 14, exposed. Using electrostatic bonding, the second of the two cover plates 16 is bonded to the sensor mechanism 12 opposite the first cover plate 16 and having its fixed electrode 18 aligned with the proof mass 14. The proof mass 14 thus operates as a moveable electrode between the two fixed electrodes 18 on either side. An electrical drive and sense circuit 20 measures differential capacitance between the proof mass 14 and each of the opposing fixed electrodes 18 as a function of the displacement of the proof mass 14 resulting from an acceleration force applied along an input axis I, and outputs a resulting acceleration signal.

The sensor mechanism 12 is structured having one or more pairs of flexures, indicated generally at 22, that are structured according to the invention for pliantly suspending the proof mass 14 from an inner sensor frame or plate 24 for movement of the proof mass 14 along the input axis I normal to the proof mass 14. Each pair of flexures 22 defines a linear hinge axis H about which the proof mass 14 moves in response to an applied force, such as the acceleration of the accelerated body having the accelerometer 10 mounted thereon. As illustrated in FIG. 1, the flexures 22 are identical in thickness to the remainder of the sensor mechanism 12, because they are similarly formed in the epitaxial growth or active layer grown on the silicon substrate and are similarly structured using one of the RIE or DRIE processes that do not permit changes in material thickness. The flexures 22 therefore are structured according to the invention using an arcuate shape, shown in FIG. 2, that is used to control flexure stiffness and to accurately position the hinge axis H.

Figure 2:
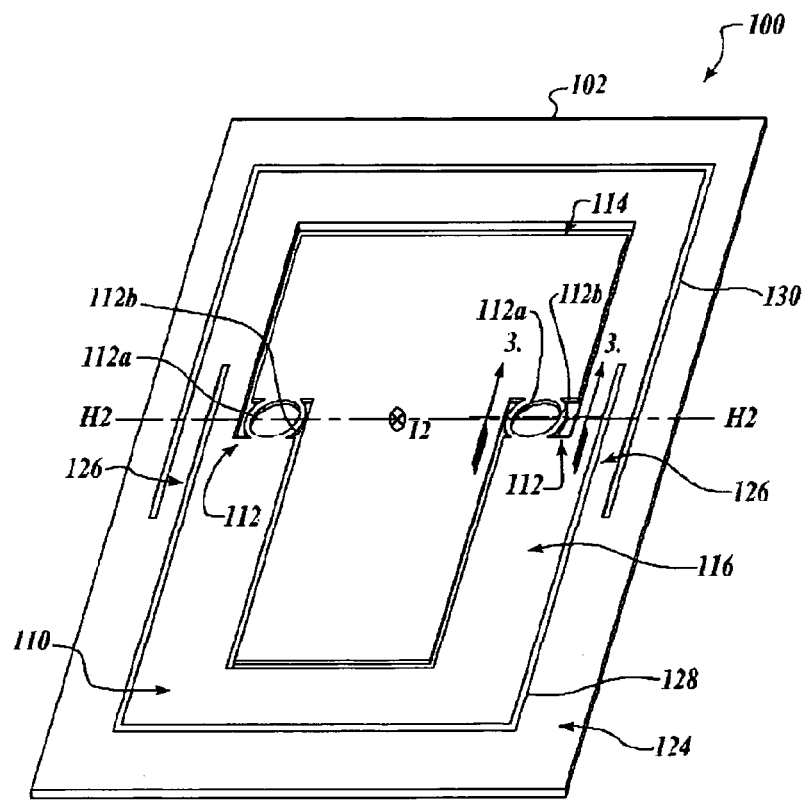
FIG. 2 is a plan view of an accelerometer mechanism die having the apparatus and method of the invention embodied therein as a pair of semicircular flexures.

FIG. 2 illustrates the apparatus and method of the invention embodied by example and without limitation in a suspension structure for pliantly suspending a proof mass in another single proof mass micro-machined electromechanical sensor (MEMS) accelerometer 100, commonly referred to as a Tee design. The invention is similarly practicable as a suspension structure for pliantly suspending a proof mass in another pendulous mass accelerometer such as one of the different accelerometer designs illustrated in each of U.S. Pat. No. 5,287,744, ACCELEROMETER WITH FLEXURE ISOLATION, issued to Norling, et al. on Feb. 22, 1994; U.S.

Pat. No. 4,944,184, ASYMMETRIC FLEXURE FOR PENDULOUS ACCELEROMETER, issued to Blake, et al. on Jul. 31, 1990; and U.S. Pat. No. 6,282,959, COMPENSATION OF SECOND-ORDER NON-LINEARITY IN SENSORS EMPLOYING DOUBLE-ENDED TUNING FORKS, issued to Blake, et al. on Sep. 4, 2001, which are all incorporated herein by reference.

The accelerometer 100 in FIG. 2 is formed, as described above, in an epitaxial or "active" layer 102 of semiconductor material grown on a silicon substrate (not shown). The accelerometer 100 includes an acceleration sensor mechanism 110 having one or more pairs of flexures 112 structured according to the invention for pliantly suspending a proof mass 114 from an inner sensor frame or plate 116 for movement of the proof mass 114 along an input axis I2 normal to the proof mass 114. Each of the two pairs of flexures 112 define coincident linear hinge axes H2 about which the proof mass 114 moves in response to an applied force, such as the acceleration of the accelerated body having the accelerometer 100 mounted thereon. The proof mass 114 is thus operable as a rotatable or "moveable" electrode. As described above, top and bottom cover plates (not shown) are structured with opposing fixed electrodes and are bonded to opposite sides of the sensor mechanism 100 to form capacitive force sensors in combination with the moveable electrode 114.

The sensitive acceleration sensor mechanism 110 is supported by mechanical coupling of the accelerometer sensor frame 116 to a pair of cover plates 16, as shown in FIG. 1, one of which in turn is typically connected to a ceramic or metal mounting plate (not shown). The sensor frame 116 may be suspended from a second outer or external frame portion 124 by flexures 126 formed by overlapping slots 128 and 130 through the layer 102. The sensor frame 116 is thus able to move relative to the outer frame 124, as described above and in U.S. Pat. No. 5,948,981, Vibrating Beam Accelerometer, issued to Woodruff on Sep. 7, 1999, and assigned to the Assignee of the present application, which is incorporated herein by reference. Such isolation minimizes the distortion of the sensor frame 116, and thereby decreases the effects of external stresses and strains on the sensor mechanism.

The flexures 112 are structured in the epitaxial semiconductor layer 102 using one of the RIE or DRIE processes. The flexures 112 are arcuately shaped having first and second curved or rounded arch members 112a and 112b that lie in the plane of the epitaxial semiconductor layer 102 each of the flexures 112a, 112b are formed with first and second ends, the first ends are structured for connection to the support structure, i.e., the sensor frame 116, and the second ends are structured for connection to the movable structure, i.e., the proof mass 114. The arcuate shape of the first and second flexures 112a, 112b are aligned with one another, but the arcuate shape of each flexure faces oppositely each from the arcuate shape of the other flexure, as illustrated in FIG. 2.

The first and second flexures 112a, 12b together form a hinge having an axis of rotation H2 in the plane of the first and second arcuate shapes that extends linearly through the first and second flexures. In cross-section, the first and second flexures 112a, 12b are substantially rectangularly shaped, each having its major axis lying in a plane that is substantially parallel with the plane of the epitaxial semiconductor layer 102 and the axis of rotation H2, and its minor axis lying substantially cross-wise to the plane of the epitaxial layer 102 or through it thickness. Thus, as illustrated in FIG. 3, the cross-section of the flexures 112a, 12b is substantially extended in the plane of the arcuate shape relative to the cross-section taken cross-wise to the plane of the arcuate shape.

Figure 3:
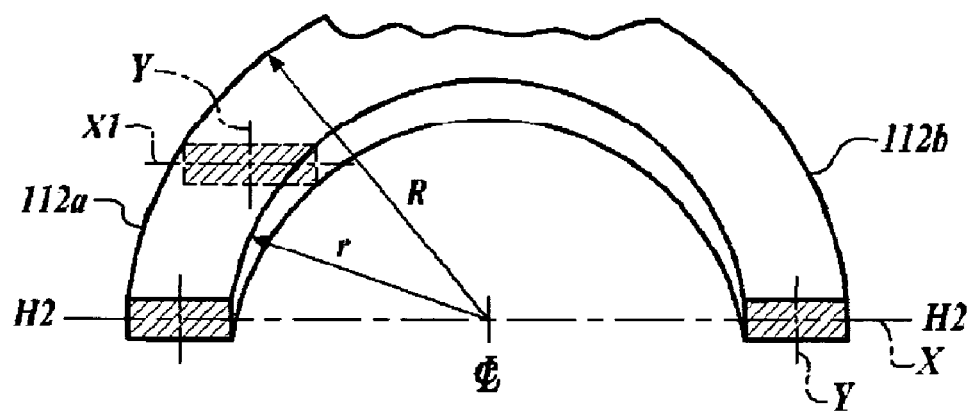
FIG. 3 is a cross-section taken through one of the pair of semicircular flexures illustrated in FIG. 2, which illustrates that the major axis of the substantially rectangular cross-section is substantially longer than the minor axis.

FIG. 3 shows a cross-section taken through the first flexure 112a along the hinge axis H2, which illustrates that the major axis X of the substantially rectangular cross-section is substantially longer than its minor axis Y that is aligned along the hinge axis H2. The arcuate shape of each of the flexures 112a, 12b includes a respective portion, shown in FIG. 3, that is aligned substantially cross-wise to the axis of rotation H2. The axis of rotation H2, i.e., the hinge axis, extends through these respective cross-wise portions of the flexures 112a, 112b.

One drawback to the prior art rectangular-style flexures is that they are essentially two-dimensional designs that do not permit changes in material thickness that can be used to control flexure stiffness. This inability to control flexure stiffness by varying material thickness is avoided by the feature of the arcuate flexure geometry of the present invention that provides a cross-section having a major axis that can be varied by changing the relative inside and outside radii, r and R, respectively, of the arcuate forms. For example, when the inside and outside radii are concentric, increasing the difference between the inside and outside radii increases the major axis X of the rectangular cross-section relative to the minor axis Y, while decreasing the difference decreases the major axis relative to the minor axis. The arcuate beam geometry of the present invention thus provides a distinct advantage over the rectangular-style flexures of the prior art.

Furthermore, when the flexures 112a, 112b are formed with concentric inner and outer radii r and R, respectively, the curvature of the flexures 112a, 12b causes the length of the major axis X of the cross-section to increase to a length X1 along the direction of the axis of rotation H2 as the a function of increasing distance from the axis of rotation, while the length of the minor axis Y remains substantially constant. In other words, the width of the flexures 112a, 112b is a minimum at the axis of rotation H2, and the flexures 112a, 112b become wider in cross-section as cross-sections are taken further from the axis of rotation H2. At the same time the thickness of the epitaxial semiconductor layer 102 remains substantially constant, so that the length of the minor axis Y does not change.

Figure 4:
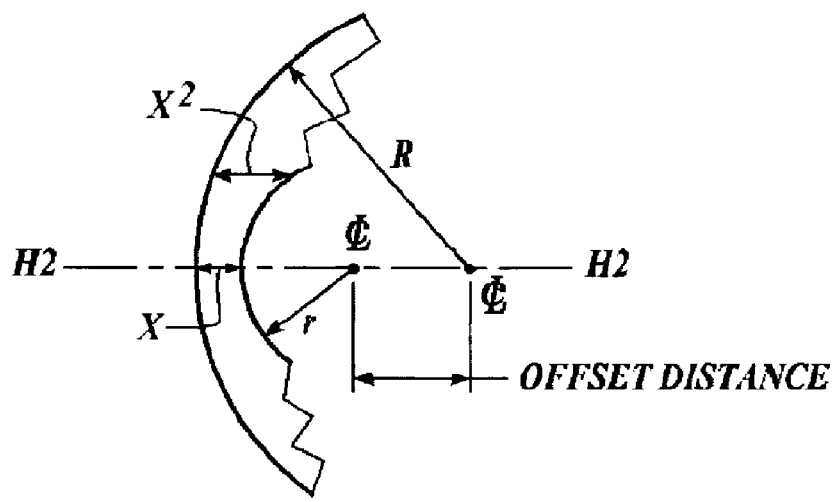
FIG. 4 illustrates an enhanced tendency for the major axis of the pair of semicircular flexures to increase as a function of increasing distance from an axis of rotation.

FIG. 4 illustrates that this tendency for the major axis X to increase as a function of increasing distance from the axis of rotation is enhanced by increasing the outer radius R and positioning its centerline offset at a distance from the centerline of the inner radius r along the axis of rotation H2 in the concave direction of the arcuate shape. Thus, the inner and outer radii r, R are in closest proximity where the cross-section intersects the axis of rotation H2, and the distance X between the inner and outer radii increases rapidly to X2 as distance from the axis of rotation increases.

The arcuate shaped suspension apparatus of the present invention is stiffer when loaded in-plane, i.e., in the plane containing the arcuate shape, than when loaded out-of-plane, i.e., along the accelerometer input axis I. The arcuate shape and relatively wide in-plane cross-section of the suspension apparatus provide a high modulus of rigidity in the plane of the arcuate shape, and the flat, planar shape and relatively thin out-of-plane cross-section cause it to have a very low out-of-plane modulus of rigidity. The suspension apparatus thus transfers in-plane loads along the arch of the wide, arcuate shape of the suspension apparatus causing it to be strong and stiff. In contrast, the suspension apparatus flexes or bends when subjected to out-of-plane loads, which causes it to be very flexible. This flexing or bending feature allows sensitivity to acceleration applied along input axis I, while the suspension apparatus remains rigid in the plane of the arcuate shape. The arcuate shaped suspension apparatus is thus useful as a flexure in micromachined accelerometers that are designed to be sensitive to out-of-plane force or acceleration inputs. The arcuate shaped suspension apparatus of the present invention is particularly useful in controlling rotating masses in structures where depth of structure is limited, such as structures formed using RIE and DRIE processing.

Figure 5:
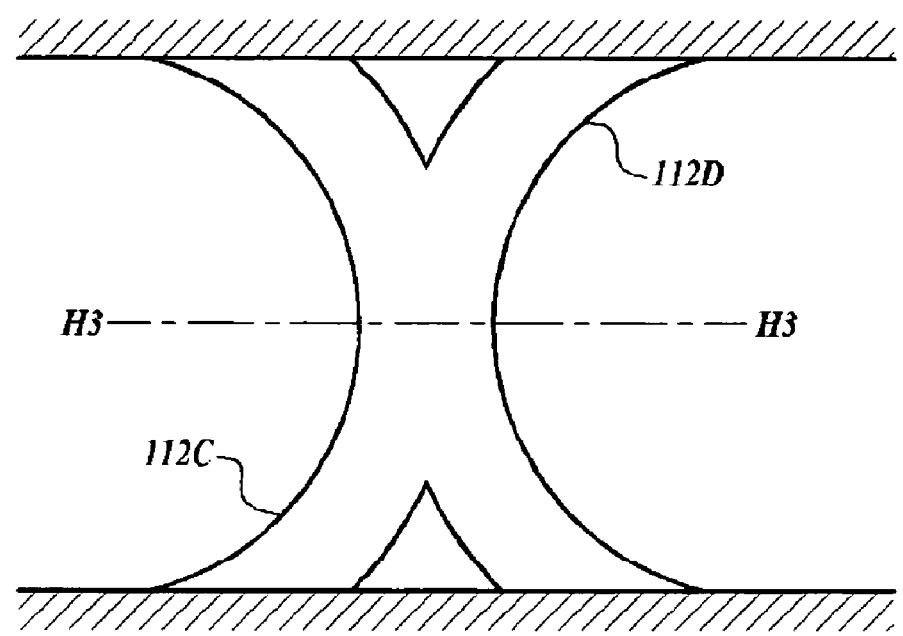
FIG. 5 illustrates that the arcuate shaped suspension apparatus can be formed in any rounded shape.

FIG. 5 illustrates that, while the arcuate shaped suspension apparatus of the invention is embodied in FIG. 2 as two flexures 112 each formed of pairs of semi-circular flexures 112a, 112b that combine form substantially circular flexures 112, the individual flexure members 112a, 112b of the arcuate shaped suspension apparatus of the invention do not need to be semi-circular flexure members, nor do the pairs of the individual flexure members 112a, 112b need to form completely circular flexures 112. Rather, the arcuate shaped suspension apparatus can be formed in any curved or rounded shape. The completely circular arcuate shaped suspension apparatus functions well as a hinge axis because the individual semi-circular flexure members 112a, 112b flex or bend at a predictable place, i.e., across the center at hinge axis H3, in response to a force or acceleration applied along the input axis I2, while remaining rigid in the two in-plane axes. In the exemplary embodiment of the arcuate shaped suspension apparatus of the invention illustrated in FIG. 5, two individual semi-circular flexure members 112c, 112d lie with their respective outer arcuate shapes facing toward each other and are interconnected at the peaks of their respective arches in an "X" configuration that exhibits many of the characteristics of a circular suspension apparatus.

Figure 6A:
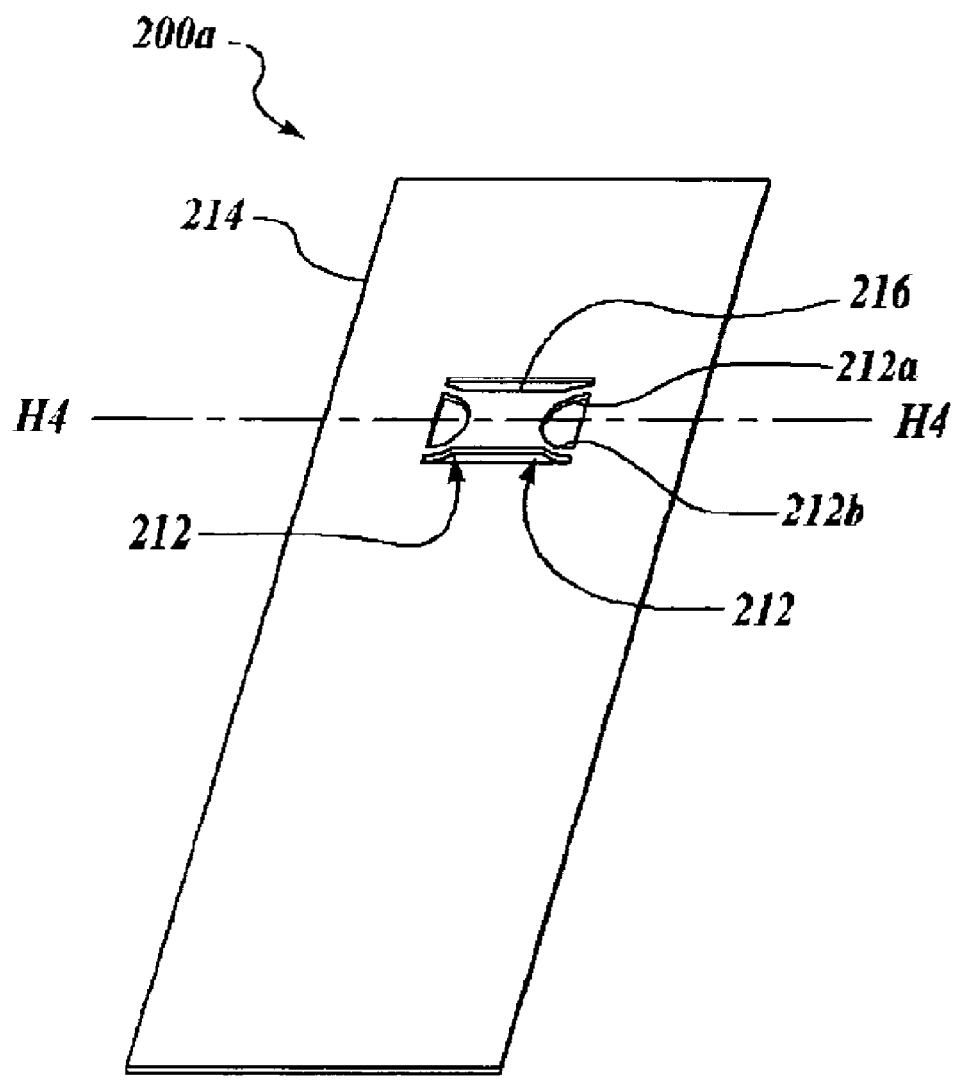
FIG. 6 illustrates the arcuate shaped suspension apparatus of the invention embodied in another accelerometer as two pair of flexures pliantly suspending a proof mass from a support structure embodied as an inner sensor plate in a "teeter-totter" arrangement.
Figure 6B:
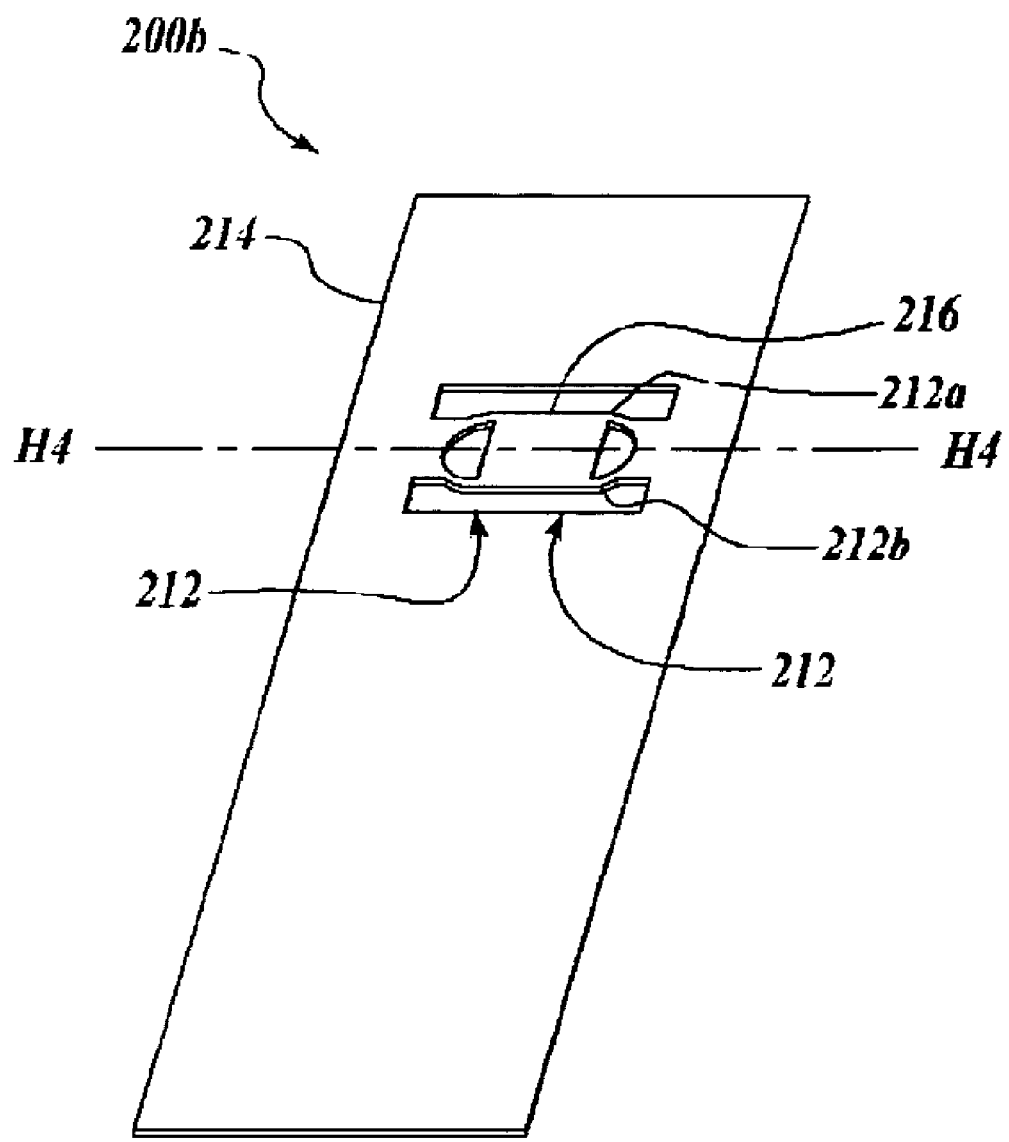

FIGS. 6A and 6B illustrate the arcuate shaped suspension apparatus of the invention embodied in other accelerometers 200a and 200b, respectively, as two pair of flexures 212 pliantly suspending an epitaxial semiconductor proof mass 214 from a support structure embodied as an inner sensor plate 216 in a "teeter-totter" arrangement between fixed electrodes (not shown) for measuring forces applied to the proof mass 214.

Each of the flexures includes first and second arcuately shaped flexure members 212a, 212b each having a first end structured for connection to the inner sensor plate 216 and a second end structured for connection to the movable proof mass 214 that is to be suspended from the inner sensor plate 216. The first and second flexure members 212a, 212b both lie in the same plane and are aligned, as illustrated in FIG. 6A, with their respective outer arcuate shapes facing oppositely each from the other and forming a hinge having an axis of rotation or hinge axis H4 in the plane of the first and second arcuate shapes that extends linearly through respective portions of the first and second flexure that are aligned substantially cross-wise to the axis of rotation.

Alternatively, as illustrated in FIG. 6B, the flexure members 212a, 212b of each pair of flexures 212 are aligned with their respective outer arcuate shapes facing toward each other and similarly forming a hinge having an axis of rotation or hinge axis H4 in the plane of the first and second arcuate shapes that extends linearly through respective portions of the first and second flexure that are aligned substantially cross-wise to the axis of rotation.

In FIGS. 6A and 6B the arcuate shaped suspension apparatus of the invention are embodied in a pair of quarter-round flexure members 212a, 212b of substantially identical shape each being aligned with the interior of their respective arcuate shape facing one toward the other. As illustrated by example and without limitation in FIGS. 6A, 6B, each of the flexure members 212a, 212b of the two flexures 212 may be structured with their inner and outer radii being substantially concentric, as shown in FIG. 3, and each of the two different pairs of flexure members 212a, 212b may share substantially the same center point which also lies on the hinge axis H4. The two flexures 212 formed of quarter-round flexure members 212a, 212b result in a suspension apparatus that is much stiffer in the rotational axis than that formed of two pair of semicircular flexure members 112a, 112b, as illustrated in FIG. 2, while providing the in-plane rigidity that is desirable in force/displacement sensors.

Figure 7:
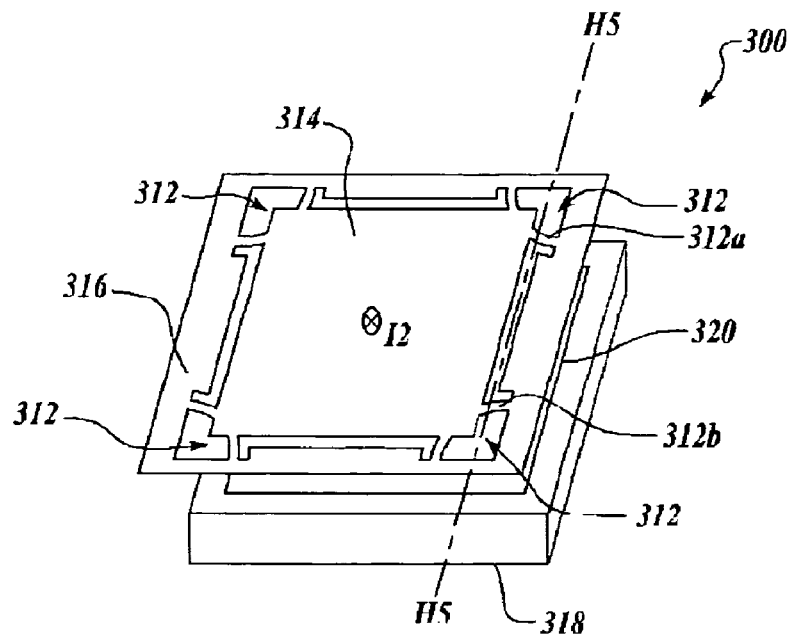
FIG. 7 illustrates the arcuate shaped suspension apparatus of the intention alternately embodied in a configuration that employs corner arches to selectively stabilize an interior mass.

FIG. 7 illustrates the arcuate shaped suspension apparatus of the invention alternately embodied by example and without limitation in a configuration that employs corner arches to selectively stabilize an interior mass. The arcuate shaped suspension apparatus of the intention is, for example, embodied in a capacitive accelerometer 300 as four flexures 312 pliantly suspending an interior proof mass 314 from a support structure embodied as an outer sensor frame or plate 316 in a "trampoline" arrangement for measuring forces applied to the epitaxial proof mass 314. The capacitive accelerometer 300 illustrated in FIG. 7 is constructed in an epitaxial semiconductor layer using conventional microcircuit techniques as described herein and includes a pair of glass plates 318 (bottom plate shown) having opposed parallel planar faces. The plates 318 are spaced from one another and each has a metal layer electrode 320 of predetermined configuration deposited on one surface to form a capacitor plate. The interior epitaxial semiconductor layer proof mass 314 suspended from the outer sensor frame 316 is positioned between the metal layer electrodes 320 to form a common capacitor plate which moves in response to an applied force or acceleration. The outer sensor frame 316 is attached to the opposed faces of the top and bottom glass plates 318 with the interior proof mass 314 suspended therebetween by the four flexible flexures 312 forming two pairs of capacitor plates with the metal layer electrodes 320 on the opposed top and bottom glass plates 318. Movement of the interior semiconductor proof mass 314 in response to an applied force or acceleration changes the spacing between the interior semiconductor proof mass 314 and the metal layer electrodes 320, thereby causing a change in capacitance which is indicative of the applied force or acceleration.

The metal layer electrodes 320 and the interior semiconductor proof mass 314 suspended therebetween are coupled to electrical circuits capable of measuring the capacitance between the plates formed by the respective metal layer electrodes 320 and the interior semiconductor proof mass 314. Such electrical circuits are generally well known in the art. By example and without limitation, one of such an electrical circuit is disclosed in U.S. Pat. No. 4,077,132, DIGITAL LEVEL INDICATOR, issued to Erickson on Mar. 7, 1978, which is incorporated herein by reference.

Each of the flexures 312 suspending the interior proof mass 314 includes first and second arcuately shaped flexure members 312a, 312b each having a first end structured for connection to the outer sensor frame 316 and a second end structured for connection to the movable proof mass 314 that is to be suspended from the outer sensor frame 316. The first and second flexure members 312a, 312b both lie in the same plane and are aligned with their respective outer arcuate shapes facing each toward the other, in contrast to the first and second arcuately shaped flexure members previously illustrated. Each of the different pairs of first and second flexure members 312a, 312b are spaced apart along one edge of the interior proof mass 314 in a gap formed between it and the outer sensor frame 316. The flexure members 312a, 312b form a hinge having an axis of rotation or hinge axis H5 in the plane of the first and second arcuate shapes and that extends linearly through respective portions of the first and second flexure that are aligned substantially cross-wise to the axis of rotation.

In FIG. 7 the arcuate shaped suspension apparatus of the invention are embodied in a pair of quarter-round flexure members 312a, 312b of substantially identical shape each being aligned with the interior of their respective arcuate shape facing outwardly, i.e., facing away one another. As illustrated by example and without limitation in FIG. 7, each of the flexure members 312a, 312b of the four flexures 312 may be structured with their inner and outer radii being substantially concentric, as shown in FIG. 3, with their respective centerlines lying on the hinge axis H5. The four flexures 312 formed of approximately quarter-round flexure members 312a, 312b result in a suspension apparatus that permits the interior proof mass 314 to move up and down in a "trampoline" manner relative to the outer sensor frame or plate 316 along an input axis I3 normal to the plane of the sensor 300, while providing the in-plane rigidity that is desirable in force/displacement sensors.

Figure 8:
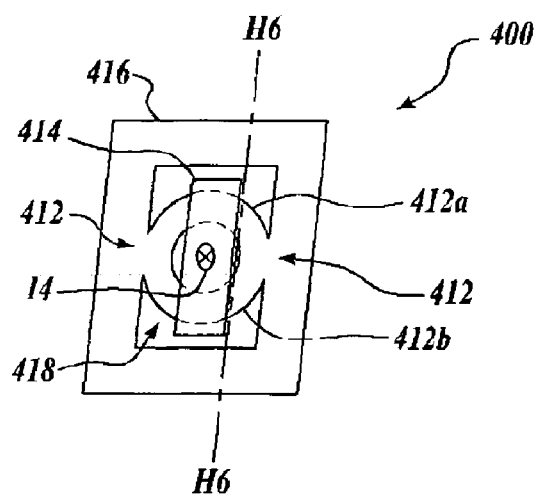
FIG. 8 illustrates the arcuate shaped suspension apparatus of the intention alternately embodied in another configuration that employs two pair of side arches to selectively stabilize an interior mass.

FIG. 8 illustrates the arcuate shaped suspension apparatus of the intention alternately embodied by another example and still without limitation in a configuration that employs two pair of side arches to selectively stabilize an interior mass. The arcuate shaped suspension apparatus of the intention is, for example, embodied in another capacitive accelerometer 400 as two flexures 412 pliantly suspending an interior proof mass 414 from a support structure embodied as an outer sensor frame or plate 416 in another "trampoline" arrangement for measuring forces applied to the proof mass 414 similar to the configuration illustrated in FIG. 7.

Each of the side flexures 412 suspending the interior proof mass 414 includes first and second arcuately shaped flexure members 412a, 412b each having a first end structured for connection to the outer sensor frame 416 and a second end structured for connection to the movable proof mass 414 that is to be suspended from the outer sensor frame 416. The first and second flexure members 412a, 412b both lie in the same plane and, in contrast to the embodiment illustrated in FIG. 7, are aligned with their respective inner arcuate shapes facing each toward the other similarly to the first and second arcuately shaped flexure members 112a, 112b illustrated in FIG. 2. Each of the different pairs of first and second flexure members 412a, 412b are spaced apart along one edge of the interior proof mass 414 in a gap formed between it and the outer sensor frame 416. The flexure members 412a, 412b form a hinge having an axis of rotation or hinge axis H6 in the plane of the first and second arcuate shapes that extends linearly through respective portions of the first and second flexure that are aligned substantially cross-wise to the axis of rotation.

In FIG. 8 the arcuate shaped suspension apparatus of the invention are embodied in a pair of quarter-round flexure members 412a, 412b of substantially identical shape each being aligned with the interior of their respective arcuate shape facing inwardly, i.e., facing toward one another. As illustrated by example and without limitation in FIG. 8, each of the flexure members 412a, 412b of the two flexures 412 may be structured with their inner and outer radii being substantially concentric, as shown in FIG. 3, with their respective centerlines being coincident and lying on the hinge axis H6. The two flexures 412 formed of quarter-round flexure members 412a, 412b result in a suspension apparatus that permits the interior proof mass 414 to move up and down in a "trampoline" manner along an input axis I4 normal to the plane of the sensor 400 relative to the outer sensor frame or plate 416, while providing the in-plane rigidity that is desirable in force/displacement sensors.

FIG. 8 also illustrates the arcuate shaped suspension apparatus of the invention embodied in an optional configuration wherein a single pair of half-round flexure members 412a, 412b of substantially identical shape extend between opposing inner walls in a space 418 within the outer sensor frame 416 and share a common centerline. Accordingly, pair of half-round flexure members 412a, 412b form a circularly shaped suspension apparatus 412 with the interior proof mass 414 suspended on top.

While the preferred embodiment of the invention has been illustrated and described, it will be appreciated that various changes can be made therein without departing from the spirit and scope of the invention.

What is claimed is:

1. A method for suspending a movable structure to be suspended from a support structure, the method comprising:
    forming in a layer of epitaxial semiconductor material having spaced apart substantially planar and parallel opposing surfaces a movable structure to be suspended adjacent to a support structure with a peripheral edge of the movable structure spaced apart from a peripheral edge of the support structure;
    forming in the layer of epitaxial semiconductor material a plurality of pairs of first and second arcuately shaped flexures having spaced apart substantially planar and parallel opposing surfaces, each of the pairs of flexures interconnecting the peripheral edge of the movable structure with the peripheral edge of the movable structure along a common axis of rotation.

2. The method of claim 1, further comprising spacing the pairs of arcuately shaped flexures along the peripheral edge of the movable structure facing the peripheral edge of the support structure.

3. The method of claim 1, further comprising spacing apart the first and second arcuately shaped flexures of each pair of arcuately shaped flexures.

4. The method of claim 1, further comprising aligning the first and second arcuately shaped flexures of each pair of arcuately shaped flexures with respective outer arcuate shapes facing in opposite directions.

5. The method of claim 1, further comprising forming part-circular suspension members by interconnecting intermediate arc portions of the first and second arcuately shaped flexures of each pair of arcuately shaped flexures.

6. The method of claim 1, further comprising forming substantially circular suspension members by forming interconnected part-circular first and second arcuately shaped flexures.

7. A method for suspending a movable structure to be suspended from a support structure, the method comprising:
    forming in a layer of epitaxial semiconductor material a movable structure to be suspended adjacent to a support structure with a peripheral edge of the movable structure being spaced apart from a peripheral edge of the support structure;
    forming in the layer of epitaxial semiconductor material a pair of first and second arcuately shaped flexures having spaced apart substantially planar and parallel opposing surfaces, the pair of flexures interconnecting the peripheral edge of the movable structure with the peripheral edge of the movable structure along a common axis of rotation.

8. The method of claim 7, further comprising a plurality of the pairs of first and second arcuately shaped flexures spaced along the peripheral edge of the movable structure facing the peripheral edge of the support structure.

9. The method of claim 7, further comprising spacing apart the first and second arcuately shaped flexures.

10. The method of claim 7, further comprising aligning the pair of first and second arcuately shaped flexures with respective outer arcuate shapes facing in opposite directions.

11. The method of claim 7, further comprising forming part-circular suspension members by interconnecting intermediate arc portions of the first and second arcuately shaped flexures.

12. The method of claim 7, further comprising forming a substantially circular suspension member by forming interconnected part-circular first and second arcuately shaped flexures.

13. A method for fabricating an acceleration sensor, the method comprising:
   in an epitaxial layer of semiconductor material having spaced apart substantially planar and parallel opposing surfaces, forming a support frame and a proof mass adjacent to the support frame, the proof mass being structured for travel in a direction crosswise to the plane of the substrate, and
   in the epitaxial layer, forming a pliant suspension member interconnected between the support frame and the proof mass, the suspension member being formed of first and second arcuately shaped flexure members each having a cross-section that is wider in a plane crosswise to the direction of travel of the proof mass relative to a plane aligned with the direction of travel.

14. The method of claim 13, further comprising forming a plurality of the pliant suspension members formed in the epitaxial layer and interconnected between the support frame and the proof mass.

15. The method of claim 14, further comprising configuring the first and second arcuately shaped flexure members of each of the plurality of pliant suspension members formed in the substrate and interconnected between the support frame and the proof mass with an outer arcuate shape of the first flexure member facing oppositely from an outer arcuate shape of the second flexure member.

16. The acceleration sensor of claim 15, further comprising configuring the oppositely facing first and second arcuately shaped flexure members of each of the plurality of pliant suspension members positioned to share a common centerline such as to form a single arcuately shaped suspension member.

17. The acceleration sensor of claim 15, further comprising configuring the oppositely facing first and second arcuately shaped flexure members of each of the plurality of pliant suspension members in a part-circular shape such as to form a single circular suspension member.

18. The acceleration sensor of claim 15, further comprising configuring the oppositely facing first and second arcuately shaped flexure members of each of the plurality of pliant suspension members in a part-circular shape having interconnected corresponding portions intermediate along the part-circular shape such as to form a single substantially cruciform shaped suspension member.

* * * * *